(12) United States Patent
Liu et al.

(10) Patent No.: US 6,714,956 B1
(45) Date of Patent: Mar. 30, 2004

(54) HARDWARE ACCELERATOR FOR NORMAL LEAST-MEAN-SQUARE ALGORITHM-BASED COEFFICIENT ADAPTATION

(75) Inventors: Dake Liu, Sundbyberg (SE); Stig Stuns, Sundbyberg (SE); Harald Bergh, Sundbyberg (SE); Nick Skelton, Sundbyberg (SE)

(73) Assignee: Via Technologies, Inc., Taipei (TW)

( * ) Notice: Subject to any disclaimer, the term of this patent is extended or adjusted under 35 U.S.C. 154(b) by 652 days.

(21) Appl. No.: 09/624,430

(22) Filed: Jul. 24, 2000

(51) Int. Cl.$^7$ ............................................. G06F 17/10
(52) U.S. Cl. ....................................................... 708/322
(58) Field of Search ................................. 702/300, 301, 702/303, 319, 320, 322, 323; 735/232

(56) References Cited

U.S. PATENT DOCUMENTS

| | | | | |
|---|---|---|---|---|
| 5,282,155 A | * | 1/1994 | Jones | 708/322 |
| 5,287,299 A | * | 2/1994 | Lin | 708/627 |
| 5,703,904 A | * | 12/1997 | Langberg | 375/232 |

* cited by examiner

*Primary Examiner*—Chuong Dinh Ngo
(74) *Attorney, Agent, or Firm*—Cooper & Dunham LLP

(57) ABSTRACT

A system and method for accelerating least-mean-square algorithm-based coefficient adaptation which executes in one machine clock cycle one tap of the least-mean-square algorithm including data fetch, coefficient fetch, coefficient adaptation, convolution, and write-back of a new coefficient vector. A data memory stores an input signal. A coefficient memory stores a coefficient vector. A multiplication and accumulation unit reads the input signal from the data memory and the coefficient vector from the coefficient memory to perform convolution. A coefficient adaptation unit separate from the multiplication and accumulation unit reads the input signal from the data memory and reads the coefficient vector from the coefficient memory to perform coefficient adaptation at the same time that the multiplication and accumulation unit performs the reading to produce an adapted coefficient vector which is written back into the coefficient memory for use by the multiplication and accumulation unit during a next iteration of convolution to produce an output signal, wherein each tap is executed in one machine clock cycle.

10 Claims, 7 Drawing Sheets

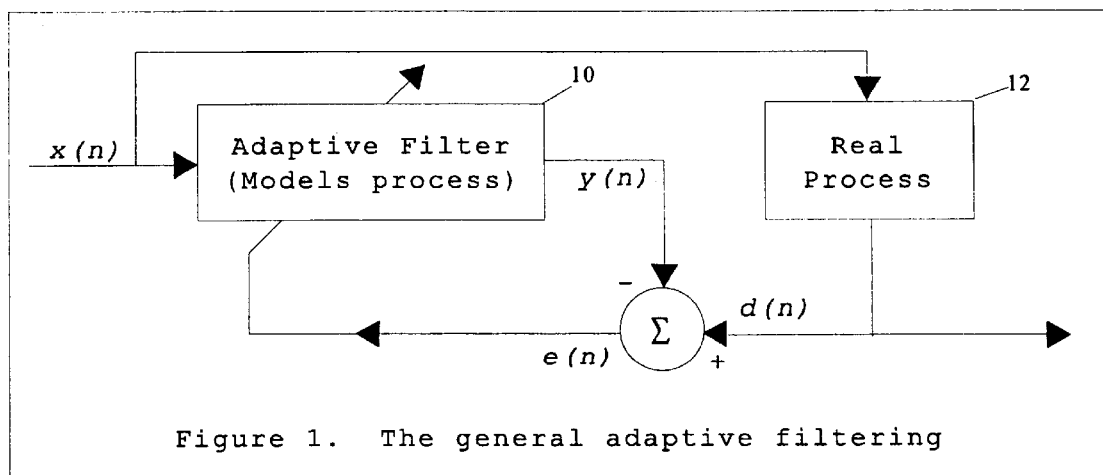
Figure 1. The general adaptive filtering

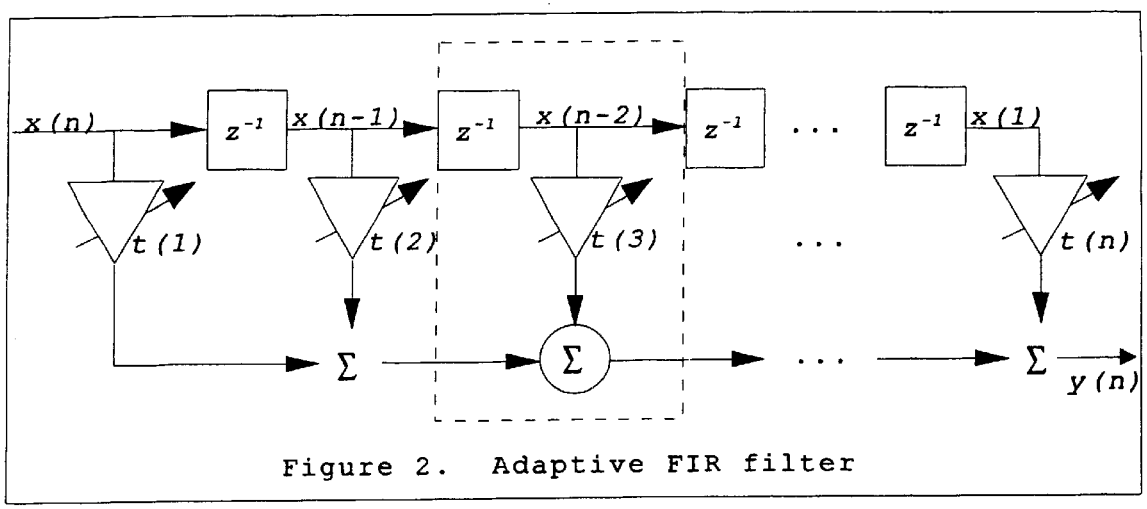
Figure 2. Adaptive FIR filter

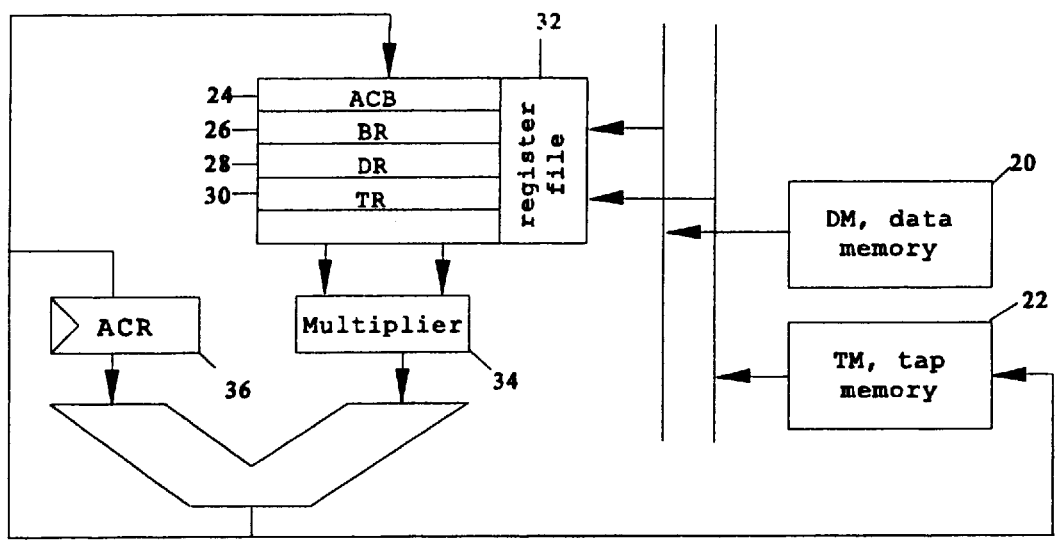
Figure 3. The conventional DSP architecture for FIR adaptive filter

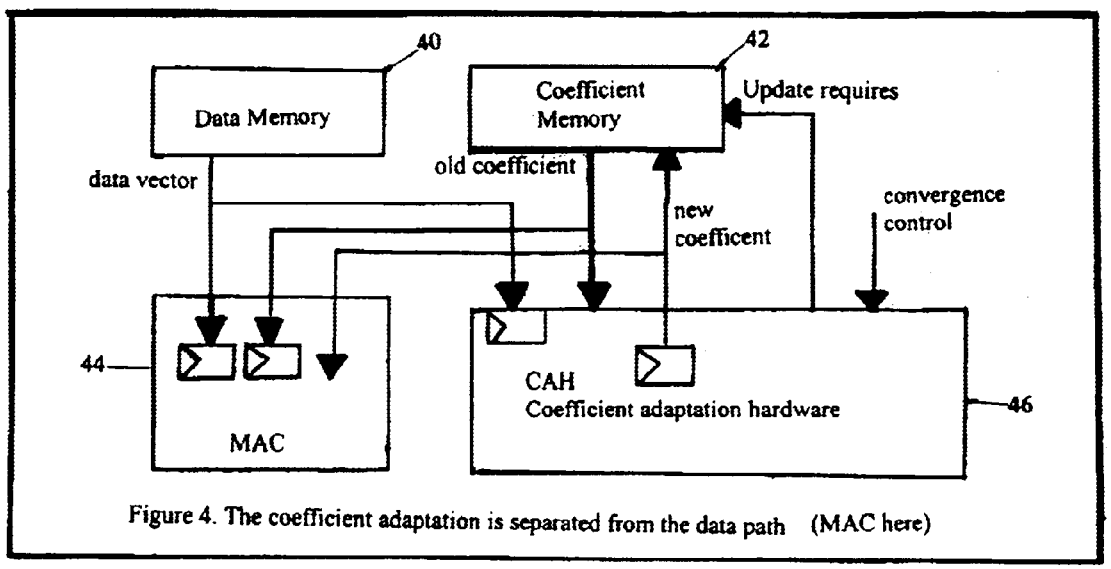
Figure 4. The coefficient adaptation is separated from the data path (MAC here)

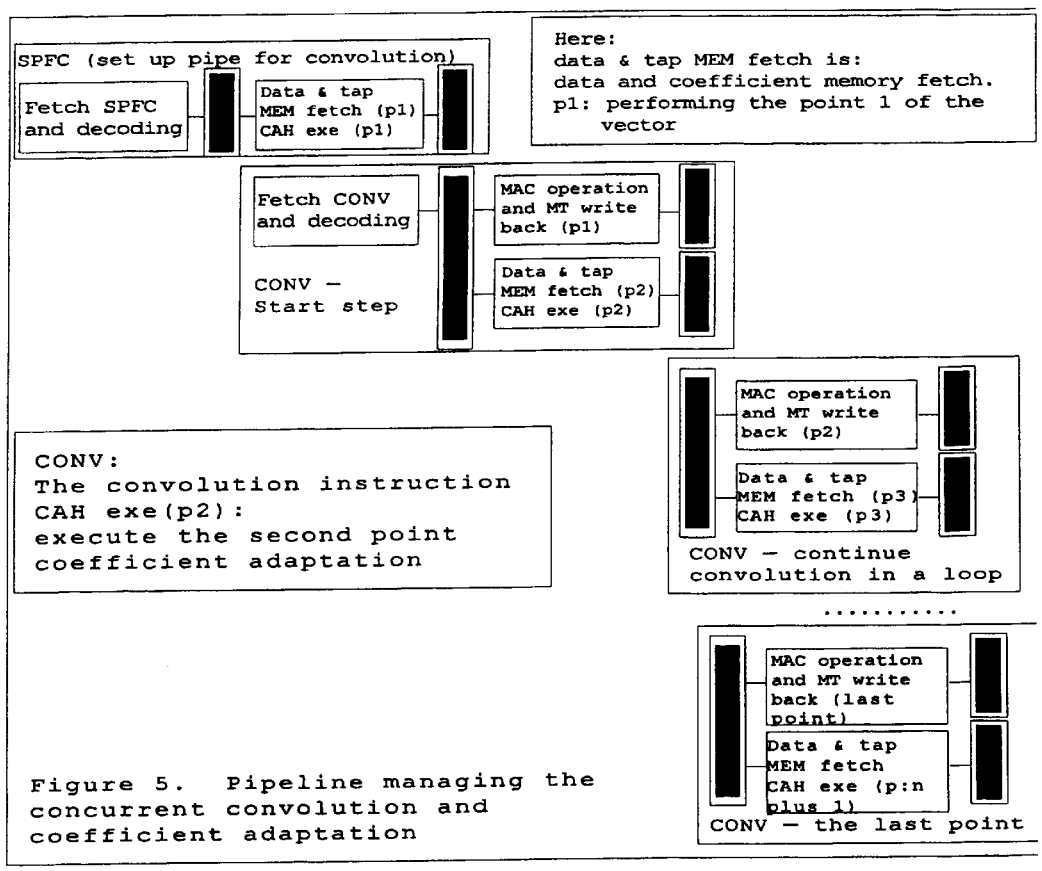
Figure 5. Pipeline managing the concurrent convolution and coefficient adaptation

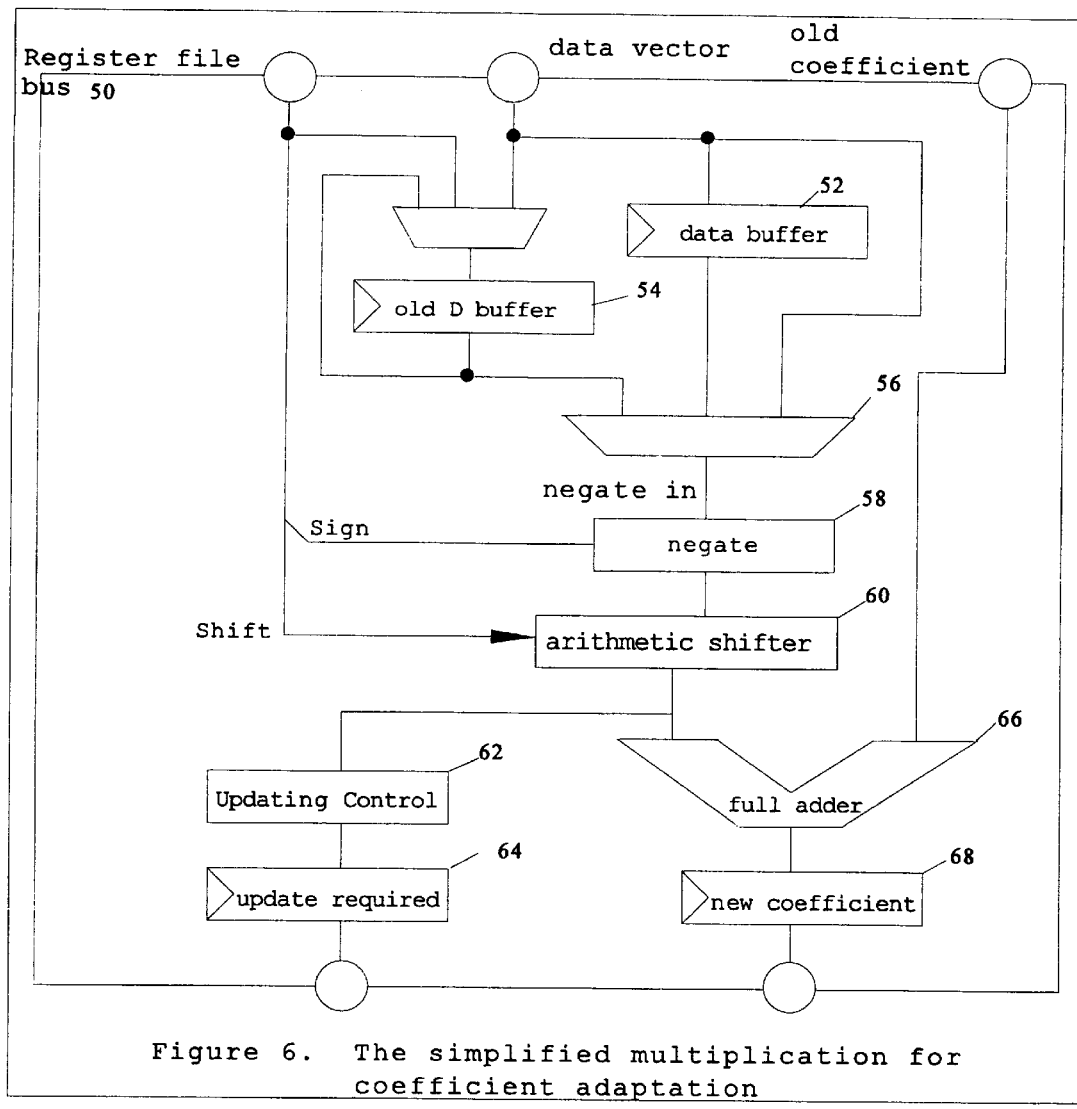
Figure 6. The simplified multiplication for coefficient adaptation

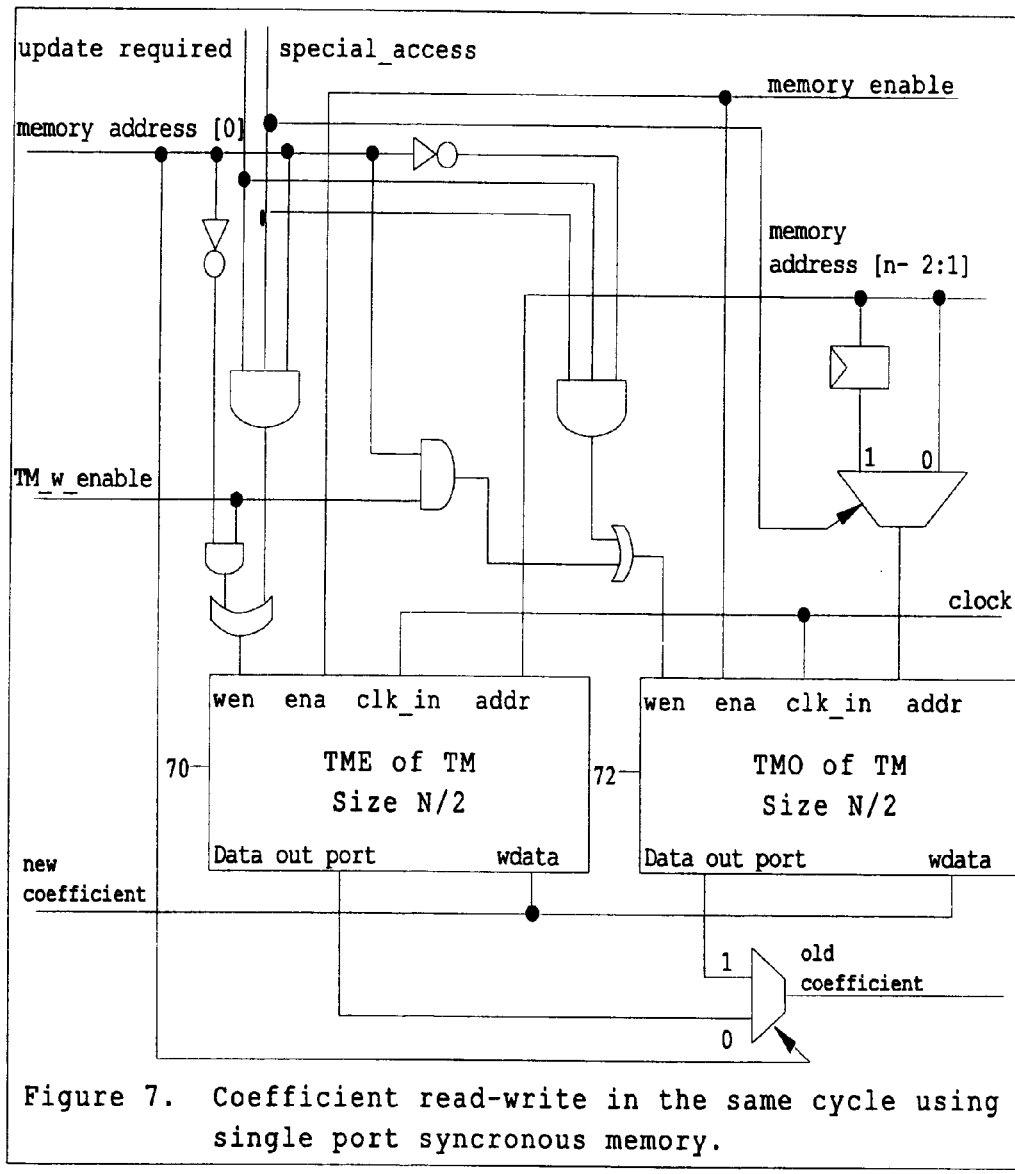
Figure 7. Coefficient read-write in the same cycle using single port syncronous memory.

HARDWARE ACCELERATOR FOR NORMAL LEAST-MEAN-SQUARE ALGORITHM-BASED COEFFICIENT ADAPTATION

FIELD OF THE INVENTION

The present invention relates generally to the field of adaptive systems, and, more particularly, to an efficient coefficient adaptation process for adaptive filters.

BACKGROUND OF THE INVENTION

An adaptive system is a system which searches for improved performance using a computational algorithm to adjust certain parameters or weights. An adaptive filter is a computational device that attempts to model the input-output relationship between two signals in real time in an interactive manner. Adaptive filters are used, for example, in communication systems for echo cancellation and line equalization. An adaptive filter is also suitable for use in real-time control systems for different kinds of applications related to real-time optimization. Adaptive signal processing is expanding in other fields as well, such as in radar, sonar, seismology, and biomedical electronics.

An adaptive filter is defined by four aspects: the input signal x(n) being processed by the filter; the structure that defines how the filter output y(n) is computed from its input signal x(n); the filter parameters that can be iteratively changed to alter the input-output relationship of the filter; and the adaptive algorithm that describes how parameters are adjusted from one time instant to the next.

An adaptive filter may be implemented as an open-loop filter or as a closed-loop filter with a performance feedback feature. The algorithm operates in an iterative manner to update the adjustable parameters with the arrival of new data and current signal performance feedback. With each iteration, the system learns more and more about the characteristics of the input signal x(n), and the signal processor makes adjustments to the current set of parameters based on the latest system performance through an error signal e(n). The optimal set of values of the adjustable parameters is then approached sequentially.

Adaptive filters are often realized as a set of program instructions running on a digital signal processor (DSP). FIG. 1 shows a general adaptive filtering process. Generally, any system with a finite number of parameters affecting how the output y(n) is computed from the input x(n) could be used as the adaptive filter 10 in FIG. 1.

The coefficient vector T(n) of the filter is defined by the equation $T(n)=[t_1(n)t_2(n) \ldots t_N(n)]^T$. As mentioned above, the input of the filter is x(n), while the output of the filter is y(n). The desired response signal is d(n). The error signal e(n) represents the difference between the desired signal d(n) and the real output y(n). The most frequently used structure of an adaptive filter is the finite-impulse-response (FIR) filter, which is shown in FIG. 2.

In FIG. 2, the unit $z^{-1}$ is called the delay unit. The filter itself is based on convolution. A complete computing step is called a "tap." FIG. 2 shows a suitable architecture because of its linearity. When performing the filtering process, the coefficient set is used to find the output through convolution using the following equation 1:

$$Y(n) = \sum_{i=1}^{n} t(i) \times (n-i) \qquad \text{Eq. 1}$$

The output y(n) might not be the desired output. That is, y(n) may be very close to the desired signal d(n), but not close enough. In that case, the adaptation algorithm would be executed to correct the coefficient set so that the output y(n) will gradually approach the desired signal d(n). The desired signal d(n) is unknown and changes all the time. Therefore, the adaptive filter is a real-time closed-loop feedback system which is adapting all the time in order to follow the desired signal of d(n).

In a high quality adaptive filter, the coefficient set is constantly adapting, which requires a lot of computing power, making the adaptive filter expensive. The most popular adaptation algorithm is called the normal least-mean-square algorithm (LMS or NLMS). The LMS algorithm makes use of the so-called "steepest descent" approach, deriving an estimation of the gradient vector based on a limited number of data samples.

This adaptation algorithm includes the processes of convergence control and coefficient adaptation. Convergence control will not be performed in every tap, meaning that the computing power associated therewith is not very high. For this reason, the present invention does not deal with optimization of the convergence control process. Coefficient adaptation, however, should be performed for all taps during each sample in order to achieve a high-performance adaptive filter. Normally, then, most of the computing power is consumed when performing coefficient adaptation.

A tap of adaptive computing includes a convolution step and a coefficient adaptation step. The task involved in tap i is shown by the following equations:

$$y(i)=y(i-1)+x(i)t(n-i) \qquad \text{eq. 2}$$

$$t_{new}(i+1)=t_{old}(i+1) \pm (\text{convergence factor})*x(i) \qquad \text{eq. 3}$$

In equation 3 above, $t_{new}(i+1)$ is the new coefficient after adaptation, and $t_{old}(i+1)$ is the old coefficient which is going to be adapted.

Because there are many taps in a sample of processing along with variable coefficients, a digital signal processor (DSP) is needed to execute the so-called LMS algorithm. FIG. 3 shows the architecture of a typical digital signal processor.

According to the algorithm associated with a typical digital signal processor, a tap of the LMS computing process includes seven steps. First, the data is loaded from the data memory DM 20 to data register DR 28. Next, the coefficient is loaded from the tap memory or coefficient memory TM 22 to coefficient register TR 30. The register ACR 36 computes coefficient adaptation using the equation $t_{new}(i)=t_{old}(i)+$ (convergence factor) * DR. The new coefficient is then moved to a buffer BR 26 (BR=ACR). In the next step, ACB is moved to ACR and convolution is performed such that ACR=ACR+data*BR. Next, the contents of ACR are moved to ACB, and finally $t_{new}(n)$ is moved to the coefficient memory TM 22.

The number of executing clock cycles for one tap may vary for different architectures. For example, seven steps are necessary when using a standard central processing unit (CPU). When using advanced digital signal processors based on multiplier-accumulator hardware, the number of clock cycles for one tap of convolution and coefficient adaptation could be between two and four.

The coefficient memory has two memory accesses: one read and one write. Because both memory accesses are required for coefficient adaptation, it is difficult to execute all seven steps in one clock cycle. A dual port memory cannot be used because the memory read and write addresses could depend on each other. An asynchronous memory may be used as the coefficient memory, but problems may result including relatively slow speed and high power consumption.

In an advanced available digital processor, a special double-speed clock (compared to the process clock) is applied just to the coefficient memory, and therefore the coefficient memory can be accessed twice in one process clock cycle. However, there is an obvious drawback. The memory speed was previously slower than the logic speed; if twice the memory is used per process cycle, the system speed will not be able to be half of the memory speed. Therefore, the system clock speed cannot be high.

It would be beneficial to reduce the computing power in an adaptive system. One essential problem preventing the reduction of the computing power is that a synchronous memory cannot be physically implemented to read from and write to any position in a single clock cycle. An asynchronous memory can read from and write to any position in a single CPU clock cycle, but only when the CPU clock is much slower than the memory access time.

Therefore, when using a synchronous memory, multiple computing steps must be used to execute one tap of adaptive filtering. And, when using an asynchronous memory, although one clock cycle can be used to execute all the steps in a tap, this can only be done when the system speed is low. Another possibility is to double the memory clock so that the memory can be accessed twice in one CPU clock cycle. The drawback, however, is that the double-speed memory becomes a "bottleneck" which limits the performance and which will be the main source of power consumption.

SUMMARY OF THE INVENTION

In modern communication and control systems, high performance adaptive filters with very low power consumption are needed. An object of the present invention is to move all computing steps into one clock cycle without introducing extra constraints or bottlenecks. The present invention accomplishes higher performance and lower power than prior art systems while providing sufficient flexibility. The present invention accomplishes the goal of one cycle solution for a complete one-tap computing process. The present invention may be implemented in hardware through either an adaptive filter accelerator in a general purpose digital signal processor (DSP) chip or through a stand-alone chip for both adaptive filtering and other normal filtering tasks.

The present invention comprises three main parts: the hardware partition, the simplified multiplication operation, and the novel method of memory read-and-write in one clock cycle using a conventional single port static random access memory (SRAM).

In summary, the present invention in one embodiment provides a system for accelerating least-mean-square algorithm-based coefficient adaptation, comprising: a data memory for storing an input signal; a coefficient memory for storing a coefficient vector; a multiplication and accumulation unit for reading the input signal from the data memory and the coefficient vector from the coefficient memory to perform convolution; and a coefficient adaptation unit separate from the multiplication and accumulation unit for reading the input signal from the data memory and for reading the coefficient vector from the coefficient memory to perform coefficient adaptation at the same time that the multiplication and accumulation unit performs the reading to produce an adapted coefficient vector which is written back into the coefficient memory for use by the multiplication and accumulation unit during a next iteration of convolution to produce an output signal, wherein each tap is executed in one machine clock cycle.

The coefficient adaptation unit may perform multiplication using an arithmetic right shift controlled by a sign-magnitude coded shift control vector. The coefficient memory may comprise an even coefficient memory and an odd coefficient memory, each storing half of the coefficient vector. The coefficient memory may have a normal memory access mode and a coefficient adaptation mode, and during the coefficient adaptation mode the coefficient memory may be read from and written to in one clock cycle. For each iteration of convolution, an updated coefficient vector is used during each tap.

The present invention in another embodiment provides a method for accelerating least-mean-square algorithm-based coefficient adaptation, comprising the steps of: (a) storing an input signal in a data memory; (b) storing a coefficient vector in a coefficient memory; (c) reading the input signal from the data memory and the coefficient vector from the coefficient memory to perform convolution; and (d) reading the input signal from the data memory and reading the coefficient vector from the coefficient memory to perform coefficient adaptation at the same time as the reading of step (c) to produce an adapted coefficient vector which is written back into the coefficient memory for use in a next iteration of convolution to produce an output signal, wherein each tap is executed in one machine clock cycle.

BRIEF DESCRIPTION OF THE DRAWINGS

FIG. 1 shows a general adaptive filtering process;

FIG. 2 shows an adaptive FIR filter;

FIG. 3 shows conventional DSP architecture for a FIR adaptive filter;

FIG. 4 shows a hardware partition of a preferred embodiment;

FIG. 5 shows a pipeline which manages concurrent coefficient adaptation and convolution, in that order;

FIG. 6 shows a simplified multiplication process for coefficient adaptation; and FIG. 7 shows a coefficient read-write process in the same cycle using a single port synchronous memory.

DETAILED DESCRIPTION OF THE PREFERRED EMBODIMENTS

FIG. 4 illustrates the hardware partition according to a preferred embodiment of the present invention. The hardware partition is used to separate the computing processes for the coefficient adaptation hardware from the conventional convolution hardware. The conventional convolution part comprises a Multiplication and Accumulation (MAC) unit. The separate part for coefficient adaptation could also be a MAC or a simplified MAC.

The Data Memory 40 stores the data vector x(n) (where n goes from 0 to N−1). The Coefficient Memory 42 stores the coefficient vector t(n) (where n goes from 0 to N−1). The complete computing tasks in a tap are divided into two "pipeline" steps. During the first pipeline step, both the data vector x(n) and the coefficient vector t(n) are read to the Multiplication and Accumulation unit (MAC) 44 and to the Coefficient Adaptation Hardware (CAH) 46. The Coefficient Adaptation Hardware (CAH) performs the coefficient adaptation in accordance with equation 3 during the first pipeline.

The adapted new coefficient is registered in the Coefficient Adaptation Hardware 46. During the next pipeline step, the updated new coefficient is written back to the Coefficient Memory 42. The FIR convolution is performed during the second pipeline step using the adapted new coefficient given by the Coefficient Adaptation Hardware 46 if the FIR is an adaptive filter. The essential feature here is that the adapted new coefficient is used for convolution in the next clock cycle in the pipeline at the current sample. This makes the algorithm delay shorter than in other architectures. If the FIR is not an adaptive filter, a normal finite impulse response will be executed. In this case, the coefficient will be constant and will be read from the Coefficient Memory 42 to the Multiplication and Accumulation Unit 44 directly.

Because the pipelined computing process is performed in parallel, the second point of the coefficient adaptation process is performed in parallel with the first point of the convolution process. In addition, the writing of the first updated new coefficient works in parallel with the reading of the second old coefficient and the second data. In this way, the complete computing for a tap of the adaptive filter is equivalently performed in one clock cycle using pipelined parallelism.

FIG. 5 illustrates the pipeline managing the concurrent convolution and coefficient adaptation. Two special instructions are specified. One instruction is SPFC (i.e., Set up Pipeline For Convolution). This instruction fetches both the first data (i.e., the input signal) and the first coefficient vector to both the Multiplication and Accumulation Unit 44 and the Coefficient Adaptation Hardware 46. At the same time, the coefficient adaptation process is executed in the Coefficient Adapatation Hardware 46 during the fetching.

Another instruction is the CONV (CONVolution hardware loop instruction). This instruction starts the hardware loop and performs the following functions. First, the adapted coefficient is written back to the previous point in the Coefficient Memory 42. Then, the Data Memory address is incremented and address module overflow is performed. Next, the Coefficient Memory address is incremented. Then, the loop counter is decreased and a check is made to see whether the loop is finished. After this, a step of convolution is performed in the Multiplication and Accumulation Unit 44. Finally, the data and coefficient are read for the next tap and coefficient adaptation for the next tap is performed.

The simplified multiplication for coefficient adaptation in accordance with the present invention will now be discussed. The coefficient adaptation process follows the function of equation 3. The computing of the coefficient adaptation requires a large dynamic range and a relatively relaxed resolution because the coefficient adaptation is a so-called "try and prove" procedure using feedback. A large multiplier (i.e., a long multiplicand) is needed to keep the required dynamic range if a multiplier is used for coefficient adaptation. This is normal when a normal general-purpose digital signal processor (DSP) is used.

After separating the Coefficient Adaptation Hardware 46 from the Multiplication and Accumulation Unit 44, the Coefficient Adaptation Hardware 46 acts as an accelerator and performs only coefficient adaptation. Therefore, the output of the Coefficient Adaptation Hardware 46 must have high dynamic range and a relaxed resolution. In the present invention, the multiplication is transferred into an arithmetic right shift controlled by a five-bits sign-magnitude coded shift control vector. Thus, the computing power necessary for coefficient adaptation is reduced.

The convergence factor in equation 3 is a constant during a sample of adaptation computing. The convergence factor is one multiplicand and will be transferred to the shift control vector. Another multiplicand, the data, will be kept to be shifted. The sign-magnitude shift control vector is generated according to Table 1.

TABLE 1 a multiplicand is transferred into a shift control vector.

| Multiplicand | Shift control |
|---|---|
| S11X-XXXX-XXXX-XXXX | S0000 |
| S10X-XXXX-XXXX-XXXX OR S011-XXXX-XXXX-XXXX | S0001 |
| S010-XXXX-XXXX-XXXX OR S001-1XXX-XXXX-XXXX | S0010 |
| S001-0XXX-XXXX-XXXX OR S000-11XX-XXXX-XXXX | S0011 |
| S000-10XX-XXXX-XXXX OR S000-011X-XXXX-XXXX | S0100 |
| S000-010X-XXXX-XXXX OR S000-0011-XXXX-XXXX | S0101 |
| S000-0010-XXXX-XXXX OR S000-0001-1XXX-XXXX | S0110 |
| S000-0001-0XXX-XXXX OR S000-0000-11XX-XXXX | S0111 |
| S000-0000-10XX-XXXX OR S000-0000-011X-XXXX | S1000 |
| S000-0000-010X-XXXX OR S000-0000-0011-XXXX | S1001 |
| S000-0000-0010-XXXX OR S000-0000-0001-1XXX | S1010 |
| S000-0000-0001-0XXX OR S000-0000-0000-11XX | S1011 |
| S000-0000-0000-10XX OR S000-0000-0000-011X | S1100 |
| S000-0000-0000-010X OR S000-0000-0000-0011 | S1101 |
| S000-0000-0000-0010 OR S000-0000-0000-0001 | S1110 |
| S000-0000-0000-0000 | S1111 |

Table 1 is only one example and shows a general transformation method. The table shows that N bit two's compliment binary code is transferred into N groups of code so that the resolution of $_{2N}$ is relaxed to N. The table transfers two's compliment fractional binary data into sign-magnitude fractional binary data with a relaxed resolution and high dynamic range. "S" refers to the "sign" bit. The transferred shift control gives the control of shifting the number of position. For example, S0111 will give a seven bits arithmetic right shift.

Using the shift control vector transferred by Table 1 above, the multiplication for the coefficient adaptation is simplified as a shift function. This decreases both the power consumption and the cost of the silicon area. This also decreases the timing critical path and simplifies the pipeline. The coefficient adaptation hardware is therefore simplified and an example is shown based on the simplified multiplications in FIG. 6. Functions illustrated in FIG. 6 are described as follows.

To execute equation 3, $t_{new}(n)=t_{old}(n)\pm$(convergence factor)*x(n), the convergence factor has been transferred to a shift control vector and is prepared on the register file bus 50. Data vector x(n) is prepared from different possible data sources on the node "negate in." The first point of the data vector must be the oldest data from the previous data vector set.

The oldest data could be reserved in the register file and sent to old D buffer 54 from the register file bus 50, or reserved and kept in the old D buffer 54 before finishing the previous convolution. The data vector for the current convolution and coefficient adaptation is from the data vector bus and pipelined by the register data buffer 52. If the sign of the shift control vector is 1, a negating operation will be performed on the data vector x(n); otherwise, the negate block 58 bypasses the data vector x(n).

The arithmetic shifter 60 performs the arithmetic shift operation according to the magnitude of the shift control vector and keeps the sign while shifting. The old coefficient is from the Coefficient Memory as represented by told(n) in equation 3 and is available at the memory access pipeline step. The full adder 66 gives the result to the register new coefficient 68 at the pipeline step for memory access. At the next pipeline step, the new coefficient will be written back to the Coefficient Memory.

The updating control block 62 checks whether the output of the arithmetic shifter 60 is zero. If the output is not zero, the update required control signal will be "true," meaning that the new coefficient is different from the old coefficient and that therefore coefficient updating is required. This function is referred to as the data-dependent memory write control, which provides an extra chance to save the data transfer and access power. The updating control signal can only be true when executing the LMS convolution loop instruction, meaning that the updating control signal should be reset after a convolution.

Next, the one clock cycle memory read and write solution will be described according to a preferred embodiment. The single port synchronous static random access memory (SRAM) is the typical memory for most digital signal processing applications. As explained previously, in the single port SRAM, there is only one operation in a clock cycle—either a read or a write —which can be performed in a single port synchronous SRAM. The least mean square (LMS) FIR adaptive filter asks to both read from the coefficient memory and write to the coefficient memory during one tap operation. This means that if a single-port synchronous SRAM is used, tap of operation cannot be executed in one clock cycle. Asynchronous SRAM can be used, and can manage read and write in one clock cycle. However, because the time consumed for a complete read-and-write asynchronous SRAM is long, the performance of the adaptive filter will be very low. Another possible classical solution is to double the memory clock so that the synchronous SRAM can have two operations in a CPU clock cycle, but the drawback is that the memory will be a bottleneck which keeps the system performance low.

The present invention involves a memory architecture which can support both memory read and write performed in a clock cycle using a single port synchronous SRAM without the structural pipeline hazard involved when reading from and writing to the coefficient memory using a physically single port memory at the same cycle. In other words, the memory taught by the present invention can be used as both a special memory and as a normal single port synchronous SRAM.

FIG. 7 is a circuit diagram illustrating the one clock memory read-and-write solution for the coefficient memory according to the present invention. The circuit accomplishes the following functions.

The coefficient memory is divided into two equal physical memories. One physical memory is used to save half of the coefficient $t(2k)(0\leq k\leq N/2-1)$, and is designated Coefficient Memory Even or Tap Memory Even (TME) 70. The other is used to save half of the coefficient $t(2k+1)$ $(0\leq k\leq N/2-1)$, and is designated Tap Memory Odd (TMO) 72.

There are two kinds of memory working modes: the coefficient adaptation mode and the normal memory access mode. In the coefficient adaptation mode, the memory is divided and both a read-from and a write-to coefficient memory can be executed at one clock cycle. In the normal memory mode TME and TMO are merged, and the coefficient memory can be accessed as a normal one-port synchronous SRAM.

When the control signal special_access is 1, the memory is in the coefficient adaptation mode, supporting both read-and-write in one clock cycle (and supporting the adaptive FIR when executing coefficient adaptation and convolution). Otherwise, the memory operates as a normal memory.

The memory address [M−1,1] ($2^M$=N) is connected to both address input ports [M−2,0] of TME 70 and TMO 72. When the memory is in coefficient adaptation mode and the coefficient memory is being read, the read memory operations are executed on both TME 70 and TMO 72. The least significant bit of memory address [0] is used to select the data read-out. When memory address [0] is 0, the memory read out is from TME 70. When memory address [0] is 1, the memory read out is from TMO 72.

When the memory is in coefficient adaptation mode, the write operation is selected by the least significant bit of the address bus. When memory address [0] is 1, the memory write is selected to TME 70 and when memory address [0] is 0, the memory write is selected to TMO 72.

When the coefficient memory TM is not in coefficient adaptation mode, the memory write enable is given together with memory address [0]. Inverted address [0] gives the write-enable to TME 70 together with the instruction TM_w_enable. Direct address [0] gives the write-enable to TMO 72 together with the instruction TM_w_enable.

When the coefficient memory TM is in coefficient adaptation mode, the memory address TMO is registered with one pipeline step lag. The address operation is therefore summarized in Table 2.

TABLE 2

The operation of the coefficient adaptation in TM.

| DP execution | memory address | loop finish flag | adaptive_filter | update requirement | TME | TMO |
|---|---|---|---|---|---|---|
| SPFC | 0000000-0 | 0 | 1 | 0 | Read 0 | No operation |
| CONV step 1 | 0000000-1 | 0 | 1 | 1 or 0 | Write 0 | Read 1 |
| CONV step 2 | 0000001-0 | 0 | 1 | 1 or 0 | Read 2 | Write 1 |
| CONV step 3 | 0000001-1 | 0 | 1 | 1 or 0 | Write 2 | Read 3 |
| CONV step 4 | 0000010-0 | 0 | 1 | 1 or 0 | Read 4 | Write 3 |
| CONV step 5 | 0000010-1 | 0 | 1 | 1 or 0 | Write 4 | Read 5 |
| ... | ... | 0 | 1 ... | 1 or 0 ... | ... | ... |
|  |  | 0 | 1 | 1 or 0 | Read N-2 |  |
| CONV step N-1 | 1111111-0 | 0 | 1 | 1 or 0 | Write N-2 | Read N-1 |
| CONV step N | 1111111-1 | 1 | 1 | 1 or 0 | Write N-1 | Don't care |
|  |  |  |  | 0 | 0 |  |

When the adapted coefficient is the same as the old coefficient, the signal update required (se FIG. 6) is 0 and there is no write permission to TME 70 or TMO 72, meaning there is no adaptation needed.6

There is only one functional address; there are two physical addresses. Therefore, the system always either reads from even (i) and writes to odd (i−1), or reads from odd (i+1) and writes to even (i) at the same cycle. When reading the coefficient on the old coefficient bus from the TME memory for convolution and performing the adaptation process (pipeline step 1), the updated new coefficient based on the old coefficient from TMO is written back to TMO. For example, during the 10th cycle, the old coefficient on the bus (vector point 11) is fetched from TMO for the next point convolution. The new coefficient 11 is calculated during fetching and is stored in the new coefficient register. The adapted coefficient 10 is written back to the coefficient memory TM through the new coefficient bus to TME. During the 11th cycle, the new coefficient 11 is written back to TMO and the old coefficient bus (vector point 12) is read from TME.

In conclusion, to emphasize the advantages provided by the present invention, it is again noted that seven steps are needed to complete a tap when using a standard digital signal processor. Using an advanced digital signal processor can decrease the number of steps from seven to five by using multiple accumulation registers. By using double multiplication-accumulation hardware and accessing both the data memory and the coefficient memory at the same clock cycle, the number of steps can be reduced to three by limiting the architecture flexibility.

By separating the adaptation hardware from the convolution hardware, simplifying the multiplication to shift, and merging the memory read-and-write into one clock cycle, the present invention decreases the number of computing step down to one—the minimum. The present invention therefore optimally decreases the computing power.

With the present invention, coefficient adaptation can easily be executed for all taps in every sample. This is different from most other available solutions. For example, if complete convolution and coefficient adaptation is performed using 1 MIP (Million Instructions Per Second), the conventional solution will use up to 7 MIPs.

Reading from and writing to the coefficient memory in one clock cycle makes it possible for a product to use a conventional single port synchronous SRAM under conventional clock and IC (Integrated Circuit) design methodology. By transforming the multiplication into a simple shift, the computing power of a multiplication and accumulation unit (MAC) can be reduced.

The present invention includes the use of a hardware lookup table, so that the process to get the shift control vector is simple. By using a data-dependent memory write, the power consumed during memory access is further decreased.

The above invention has been described with specific embodiments, but a person skilled in the art could introduce many variations on these embodiments without departing from the spirit of the disclosure or from the scope of the appended claims. The embodiments are presented for the purpose of illustration only and should not be read as limiting the invention or its application. Therefore, the claims should be interpreted commensurate with the spirit and scope of the invention.

What is claimed is:

1. A system for accelerating least-mean-square algorithm-based coefficient adaptation, comprising:

a data memory for storing an input signal;

a coefficient memory for storing a coefficient vector;

a multiplication and accumulation unit for reading the input signal from the data memory and the coefficient vector from the coefficient memory to perform convolution; and a coefficient adaptation unit separate from the multiplication and accumulation unit for reading the input signal from the data memory and for reading the coefficient vector from the coefficient memory to perform coefficient adaptation at the same time that the multiplication and accumulation unit performs the reading to produce an adapted coefficient vector which is written back into the coefficient memory for use by the multiplication and accumulation unit during a next iteration of convolution to produce an output signal, wherein each tap is executed in one machine clock cycle; and the coefficient memory includes an even coefficient memory and an odd coefficient memory, each storing half of the coefficient vector.

2. The system as set forth in claim 1, wherein the coefficient adaptation unit performs multiplication using an arithmetic right shift controlled by a sign-magnitude coded shift control vector.

3. The system as set forth in claim 1, wherein the coefficient memory has a normal memory access mode and a coefficient adaptation mode, and during the coefficient adaptation mode the coefficient memory is read from and written to in one clock cycle.

4. The system as set forth in claim 1, wherein the coefficient adaptation is performed using the equation:

$t_{new}(i+1)=t_{old}(i+1)\pm(\text{convergence factor})*x(i);$ wherein $t_{old}(i+1)$ is an old coefficient vector to be adapted, $t_{new}(i+1)$ is a new coefficient vector after adaptation, and x(i) is the input signal.

5. The system as set forth in claim 1, wherein, for each iteration of convolution, an updated coefficient vector is used during each tap.

6. A method for accelerating least-mean-square algorithm-based coefficient adaptation, comprising the steps of:

(a) dividing a coefficient memory into an even coefficient memory and an odd coefficient memory, each storing half of a coefficient vector;

(b) storing an input signal in a data memory;

(c) storing the coefficient vector in the coefficient memory;

(d) reading the input signal from the data memory and the coefficient vector from the coefficient memory to perform convolution; and (e) reading the input signal from the data memory and reading the coefficient vector from the coefficient memory to perform coefficient adaptation at the same time as the reading of step (d) to produce an adapted coefficient vector which is written back into the coefficient memory for use in a next iteration of convolution to produce an output signal, wherein each tap is executed in one machine clock cycle.

7. The method as set forth in claim 6, further comprising the step of performing multiplication using an arithmetic right shift controlled by a sign-magnitude coded shift control vector.

8. The method as set forth in claim 6, wherein the coefficient memory has a normal memory access mode and a coefficient adaptation mode, and during the coefficient adaptation mode the coefficient memory is read from and written to in one clock cycle.

9. The method as set forth in claim 6, further comprising the step of performing the coefficient adaptation using the equation:

$t_{new}(i+1)=t_{old}(i+1)\pm(\text{convergence factor})*x(i);$ wherein $t_{old}(i+1)$ is an old coefficient vector to be adapted, $t_{new}(i+1)$ is a new coefficient vector after adaptation, and x(i) is the input signal.

10. The method as set forth in claim 6, wherein, for each iteration of convolution, an updated coefficient vector is used during each tap.

* * * * *